(12) United States Patent
Lin

(10) Patent No.: US 10,249,970 B1
(45) Date of Patent: Apr. 2, 2019

(54) MEMORY DEVICE WITH PLURALITY OF INTERFACE CONNECTORS

(71) Applicant: Silicon Motion, Inc., Jhubei, Hsinchu County (TW)

(72) Inventor: Sheng-Liu Lin, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 15/938,436

(22) Filed: Mar. 28, 2018

(30) Foreign Application Priority Data

Sep. 30, 2017 (TW) .............................. 106133912 A

(51) Int. Cl.
| | |
|---|---|
| *H01R 12/71* | (2011.01) |
| *H01R 12/72* | (2011.01) |
| *H05K 1/11* | (2006.01) |
| *H05K 1/18* | (2006.01) |
| *H01R 12/73* | (2011.01) |
| *H01R 27/00* | (2006.01) |
| *H01R 12/70* | (2011.01) |

(52) U.S. Cl.
CPC ....... *H01R 12/721* (2013.01); *H01R 12/7076* (2013.01); *H01R 12/737* (2013.01); *H01R 27/00* (2013.01); *H05K 1/117* (2013.01); *H05K 1/181* (2013.01); *H05K 2201/09409* (2013.01); *H05K 2201/10015* (2013.01); *H05K 2201/10159* (2013.01); *H05K 2201/10522* (2013.01)

(58) Field of Classification Search
CPC ...... G06F 1/187; G11B 33/124; G11B 33/125

USPC ....... 439/70; 361/785, 748, 803, 679.31, 32, 361/41
See application file for complete search history.

(56) References Cited

U.S. PATENT DOCUMENTS

| | | | | |
|---|---|---|---|---|
| 4,700,880 | A | * 10/1987 | Glover | H05K 1/148 228/180.1 |
| 4,885,482 | A | * 12/1989 | Sharp | G06F 13/387 326/47 |
| 5,099,394 | A | * 3/1992 | Hood | H05K 7/1461 361/784 |
| 5,121,297 | A | * 6/1992 | Haas | H05K 3/4691 174/254 |

(Continued)

FOREIGN PATENT DOCUMENTS

TW I581267 B 5/2017

*Primary Examiner* — Hae Moon Hyeon
*Assistant Examiner* — Peter George Leigh
(74) *Attorney, Agent, or Firm* — McClure, Qualey & Rodack, LLP

(57) ABSTRACT

A memory device is provided. The memory device includes a substrate, a first interface connector, a second interface connector and a plurality of memory chips. The substrate includes a first edge, a second edge, a third edge and a fourth edge. The first interface connector is disposed on the first edge, wherein the first interface connector includes a plurality of first edge-board contacts, and the first edge-board contacts extend toward a first direction. The second interface connector is disposed on the second edge, the second interface connector includes a plurality of second edge-board contacts, and the second edge-board contacts extend toward a second direction. The memory chips are disposed on the substrate, wherein the second interface connector is located between the memory chips and the first interface connector in the first direction.

14 Claims, 5 Drawing Sheets

(56) References Cited

U.S. PATENT DOCUMENTS

| | | | | |
|---|---|---|---|---|
| 5,162,675 A * | 11/1992 | Olsen | G06F 13/409 | 326/101 |
| D353,799 S * | 12/1994 | Speiser | D13/182 | |
| 5,434,362 A * | 7/1995 | Klosowiak | H05K 1/028 | 174/254 |
| 6,097,883 A * | 8/2000 | Dell | G11C 5/04 | 361/679.32 |
| 6,111,757 A * | 8/2000 | Dell | G11C 5/06 | 361/737 |
| 6,146,150 A * | 11/2000 | Roberts | G06F 1/184 | 439/55 |
| 6,328,598 B1 * | 12/2001 | Harris, Jr. | H05K 1/141 | 439/218 |
| 7,292,950 B1 * | 11/2007 | Resnick | G06F 11/1044 | 700/1 |
| 8,379,427 B2 * | 2/2013 | Sugita | G11C 5/04 | 365/51 |
| 8,423,695 B2 * | 4/2013 | Purwin | H05K 1/117 | 361/785 |
| 8,432,708 B2 * | 4/2013 | Chen | G06F 1/26 | 361/679.31 |
| 8,456,858 B2 * | 6/2013 | Liang | G06F 1/185 | 361/679.31 |
| 8,503,187 B2 * | 8/2013 | Wu | G06F 11/325 | 361/679.31 |
| 8,514,584 B2 * | 8/2013 | Liang | G06F 1/185 | 361/679.01 |
| 8,520,401 B2 * | 8/2013 | Tian | G06F 1/185 | 361/679.31 |
| 8,625,269 B2 * | 1/2014 | Chen | G06F 1/185 | 361/679.31 |
| 8,625,303 B2 * | 1/2014 | Yin | G06F 1/185 | 361/679.31 |
| 8,854,833 B2 * | 10/2014 | Chen | G06F 1/185 | 361/784 |
| 8,942,057 B1 * | 1/2015 | Xiao | G11C 7/20 | 365/228 |
| 2005/0159035 A1 * | 7/2005 | Shih | H01R 12/87 | 439/159 |
| 2010/0061070 A1 * | 3/2010 | Koh | H05K 1/189 | 361/764 |
| 2010/0296236 A1 * | 11/2010 | Schuette | G06F 1/187 | 361/679.31 |
| 2013/0003285 A1 * | 1/2013 | Liang | G06F 1/185 | 361/679.31 |
| 2013/0114230 A1 * | 5/2013 | Zhou | G06F 1/185 | 361/803 |
| 2013/0322887 A1 * | 12/2013 | McColloch | H04B 10/00 | 398/141 |
| 2016/0179135 A1 * | 6/2016 | Kumagai | G06F 1/1613 | 361/679.31 |
| 2017/0011002 A1 * | 1/2017 | Shin | G06F 13/4282 | |
| 2017/0060199 A1 * | 3/2017 | Kim | G06F 1/20 | |
| 2017/0105314 A1 * | 4/2017 | Kim | F28D 21/00 | |

* cited by examiner

MEMORY DEVICE WITH PLURALITY OF INTERFACE CONNECTORS

CROSS REFERENCE TO RELATED APPLICATIONS

This Application claims priority of Taiwan Patent Application No. 106133912, filed on Sep. 30, 2017, the entirety of which is incorporated by reference herein.

BACKGROUND OF THE INVENTION

Field of the Invention

The present invention relates to a memory device, and in particular to a memory device having two connectors of two different interface standards.

Description of the Related Art

Conventional memory cards with M.2 interface connectors come in three different sizes: 2242 (22 mm×42 mm), 2260 (22 mm×60 mm), and 2280 (22 mm×80 mm). When the M.2 interface memory card is coupled to the PCIE slot, the M.2 interface memory card must connect to the adapter card first, and is coupled to the PCIE slot via the adapter card. Due to market demand, the adapter card is commonly bundled with the M.2 interface memory card, and the commodity cost of the M.2 interface memory card is therefore increased.

BRIEF SUMMARY OF THE INVENTION

In one embodiment, a memory device is provided. The memory device includes a substrate, a first interface connector, a second interface connector and a plurality of memory chips. The substrate includes a first edge, a second edge, a third edge and a fourth edge, wherein the first edge is parallel to the third edge, the second edge is parallel to the fourth edge, the first edge is perpendicular to the second edge, and the length of the first edge is shorter than the length of the second edge. The first interface connector is disposed on the first edge, wherein the first interface connector comprises a plurality of first edge-board contacts, and the first edge-board contacts extend toward a first direction. The second interface connector is disposed on the second edge, the second interface connector comprises a plurality of second edge-board contacts, and the second edge-board contacts extend toward a second direction. The memory chips are disposed on the substrate, wherein the second interface connector is located between the memory chips and the first interface connector in the first direction.

In one embodiment, the memory chips are arranged in the first direction.

In one embodiment, the substrate comprises a first surface and a second surface, the first surface is opposite to the second surface, the memory chips comprise at least one first flash memory chip, and the first flash memory chip is disposed on the first surface.

In one embodiment, the memory device further comprises a controller, wherein the controller is disposed on the first surface of the substrate, the controller is located between the first flash memory chip and the second interface connector in the first direction.

In one embodiment, the memory chips further comprise a DRAM chip, the DRAM chip is disposed on the first surface of the substrate, the DRAM chip is located between the first flash memory chip and the controller in the first direction.

In one embodiment, the memory chips comprise a plurality of first flash memory chips, the first flash memory chips are disposed on the first surface and arranged in the first direction, the first flash memory chips are located between the DRAM chip and the third edge.

In one embodiment, the memory device further comprises at least one passive component, the passive component is located between the controller and the first interface connector in the first direction, and the passive component is located between the second interface connector and the fourth edge in the second direction.

In one embodiment, the passive component is a capacitor.

In one embodiment, the memory device further comprises a plurality of passive components, the passive components are located between the controller and the first interface connector in the first direction, the passive components are located between the second interface connector and the fourth edge in the second direction, and the passive components are arranged in the first direction.

In one embodiment, the memory chips comprise a plurality of second flash memory chips, and the second flash memory chips are disposed on the second surface and are arranged in the first direction.

In one embodiment, the memory chips further comprise a DRAM chip, the DRAM chip is disposed on the second surface of the substrate, the DRAM chip and the second flash memory chip are arranged in the first direction.

In one embodiment, the first interface connector is an M.2 connector, and the second interface connector is a PCIE connector.

In one embodiment, the second interface connector has a connector height, the substrate has a substrate height, and the connector height is smaller than half of the substrate height.

In one embodiment, the substrate is equally compartmentalized into an upper substrate part and a lower substrate part in the second direction, and the second interface connector is only located in the lower substrate part.

Utilizing the memory device of the embodiment of the invention, the connectors of two different interfaces are integrated on one single substrate, the conventional adapter card is omitted, and the commodity cost of the memory device is therefore decreased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
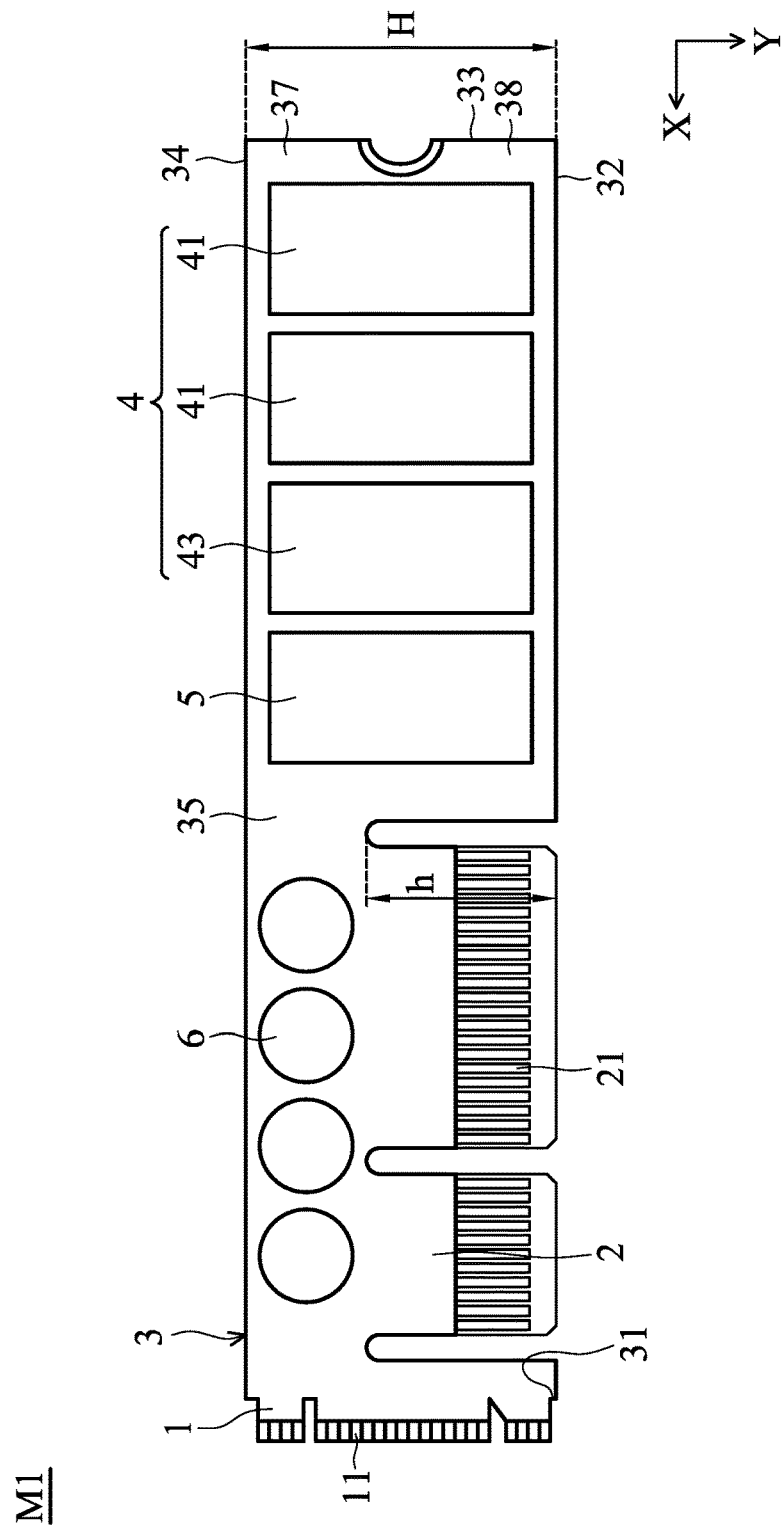
FIG. 1A shows a first surface of a memory device of a first embodiment of the invention.

FIG. 1A shows a memory device M1 of a first embodiment of the invention. The memory device M1 includes a substrate 3, a first interface connector 1, a second interface connector 2 and a plurality of memory chips 4. The substrate 3 includes a first edge 31, a second edge 32, a third edge 33 and a fourth edge 34. The first edge 31 is parallel to the third edge 33. The second edge 32 is parallel to the fourth edge 34. The first edge 31 is perpendicular to the second edge 32. The length of the first edge 31 is shorter than the length of the second edge 32. The first interface connector 1 is disposed on the first edge 31. The first interface connector 1 comprises a plurality of first edge-board contacts 11. The first edge-board contacts 11 extend toward a first direction X. The second interface connector 2 is disposed on the second edge 32. The second interface connector 2 comprises a plurality of second edge-board contacts 21. The second edge-board contacts 21 extend toward a second direction Y. The memory chips 4 are disposed on the substrate 3. The second interface connector 2 is located between the memory chips 4 and the first interface connector 1 in the first direction X.

Utilizing the memory device of the embodiment of the invention, the connectors of two different interfaces are integrated on one single substrate, the conventional adapter card is omitted, and the commodity cost of the memory device is therefore decreased.

With reference to FIG. 1A, in one embodiment, the memory chips 4 are arranged in the first direction X.

Figure 1B:
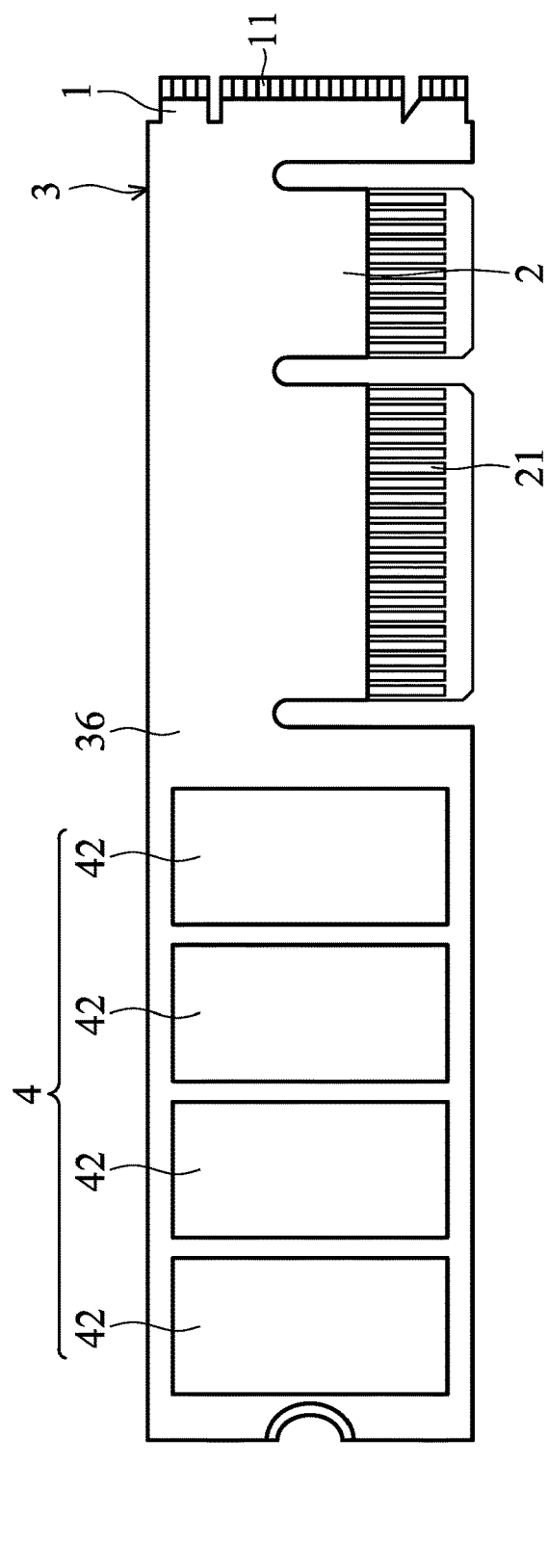
FIG. 1B shows a second surface of the memory device of the first embodiment of the invention.

With reference to FIGS. 1A and 1B, in one embodiment, the substrate 3 comprises a first surface 35 and a second surface 36. The first surface 35 is opposite to the second surface 36. The memory chips 4 comprise at least one first flash memory chip 41, and the first flash memory chip 41 is disposed on the first surface 35.

With reference to FIG. 1A, in one embodiment, the memory device M1 further comprises a controller 5. The controller 5 is disposed on the first surface 35 of the substrate 3. The controller 5 is located between the first flash memory chip 41 and the second interface connector 2 in the first direction X. In this embodiment, the controller 5 is coupled to the first interface connector 1 and the second interface connector 2 by traces formed on the substrate. The design of controller 5 being located between the first flash memory chip 41 and the second interface connector 2 in the first direction X can simplify the trace layout on the substrate.

With reference to FIG. 1A, in one embodiment, the memory chips 4 further comprise a DRAM chip 43. The DRAM chip 43 is disposed on the first surface 35 of the substrate 3. The DRAM chip 43 is located between the first flash memory chip 41 and the controller 5 in the first direction X to simplify the trace layout on the substrate.

With reference to FIG. 1A, in one embodiment, the memory chips 4 comprise a plurality of first flash memory chips 41. The first flash memory chips 41 are disposed on the first surface 35 and arranged in the first direction X. The first flash memory chips 41 are located between the DRAM chip 43 and the third edge 33.

With reference to FIG. 1A, in one embodiment, the memory device M1 further comprises at least one passive component 6. The passive component 6 is located between the controller 5 and the first interface connector 1 in the first direction X. The passive component 6 is located between the second interface connector 2 and the fourth edge 34 in the second direction Y. In this embodiment, the position of the passive component 6 sufficiently utilizes the space between the second interface connector 2 and the fourth edge 34.

In one embodiment, the passive component 6 is a capacitor. In one embodiment, the memory device M1 further comprises a plurality of passive components 6. The passive components 6 are located between the controller 5 and the first interface connector 1 in the first direction X. The passive components 6 are located between the second interface connector 2 and the fourth edge 34 in the second direction. The passive components 6 are arranged in the first direction X. However, the disclosure is not meant to restrict the invention. The passive components 6 can be other components, and the arrangement of the passive components 6 can also be modified according to the shape or the size of the passive components 6.

With reference to FIG. 1B, in one embodiment, the memory chips 4 comprise a plurality of second flash memory chips 42. The second flash memory chips 42 are disposed on the second surface 36 and are arranged in the first direction X. By disposing the second flash memory chips 42 on the second surface 36, the memory capacity of the memory device is further increased.

Figure 2A:
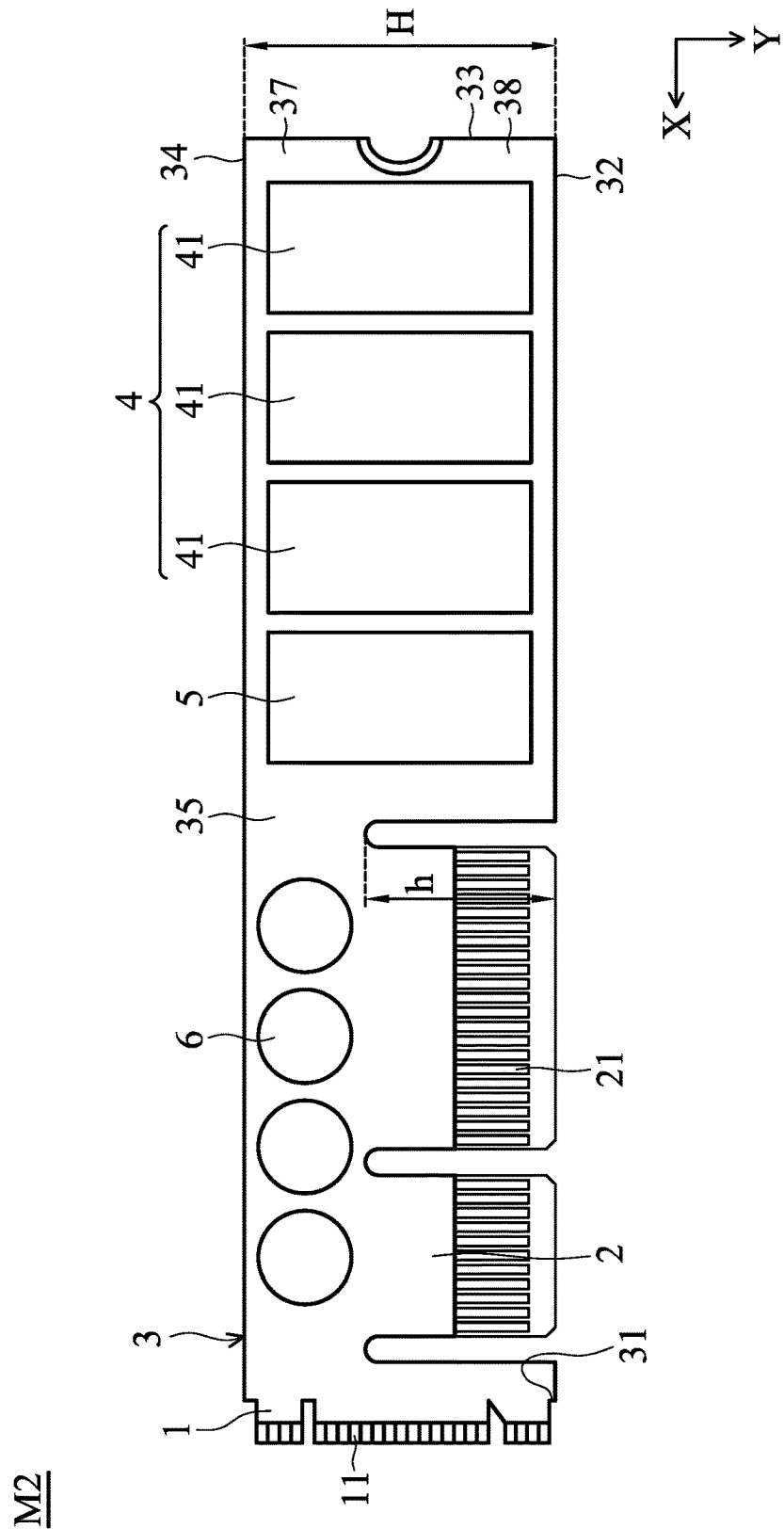
FIG. 2A shows a first surface of a memory device of a second embodiment of the invention.
Figure 2B:
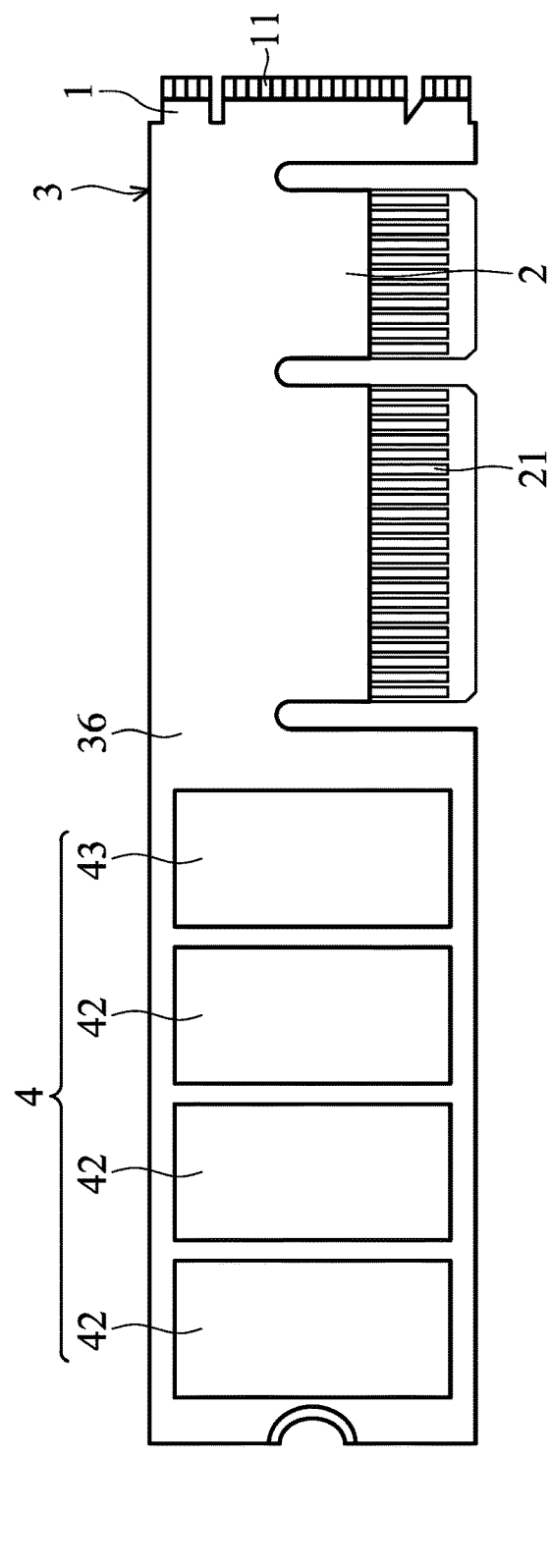
FIG. 2B shows a second surface of the memory device of the second embodiment of the invention.

FIGS. 2A and 2B shows a memory device M2 of a second embodiment of the invention. In this embodiment, the DRAM chip 43 of the memory chips 4 is disposed on the second surface 36 of the substrate. The DRAM chip 43 and the second flash memory chip 42 are arranged in the first direction X. In other words, there is no DRAM chip 43 disposed on the first surface 35.

In another embodiment, the DRAM chip can also be omitted, the memory chips of the memory device only include flash memory chips, and there is no DRAM chip disposed neither on the first surface 35 nor on the second surface 36.

In one embodiment, the first interface connector is an M.2 connector, and the second interface connector is a PCIE connector. However, the disclosure is not meant to restrict the invention. In other embodiment, the first interface connector and the second interface connector can be connectors of other standards.

With reference to FIG. 1A, in this embodiment, the second interface connector 2 has a connector height h. The substrate 3 has a substrate height H. The connector height h is smaller than half of the substrate height H. In other words, the substrate 3 is equally compartmentalized into an upper substrate part 37 and a lower substrate part 38 in the second direction Y, and the second interface connector 2 is located on the lower substrate part 38 and a portion of the upper substrate part 37.

Figure 3:
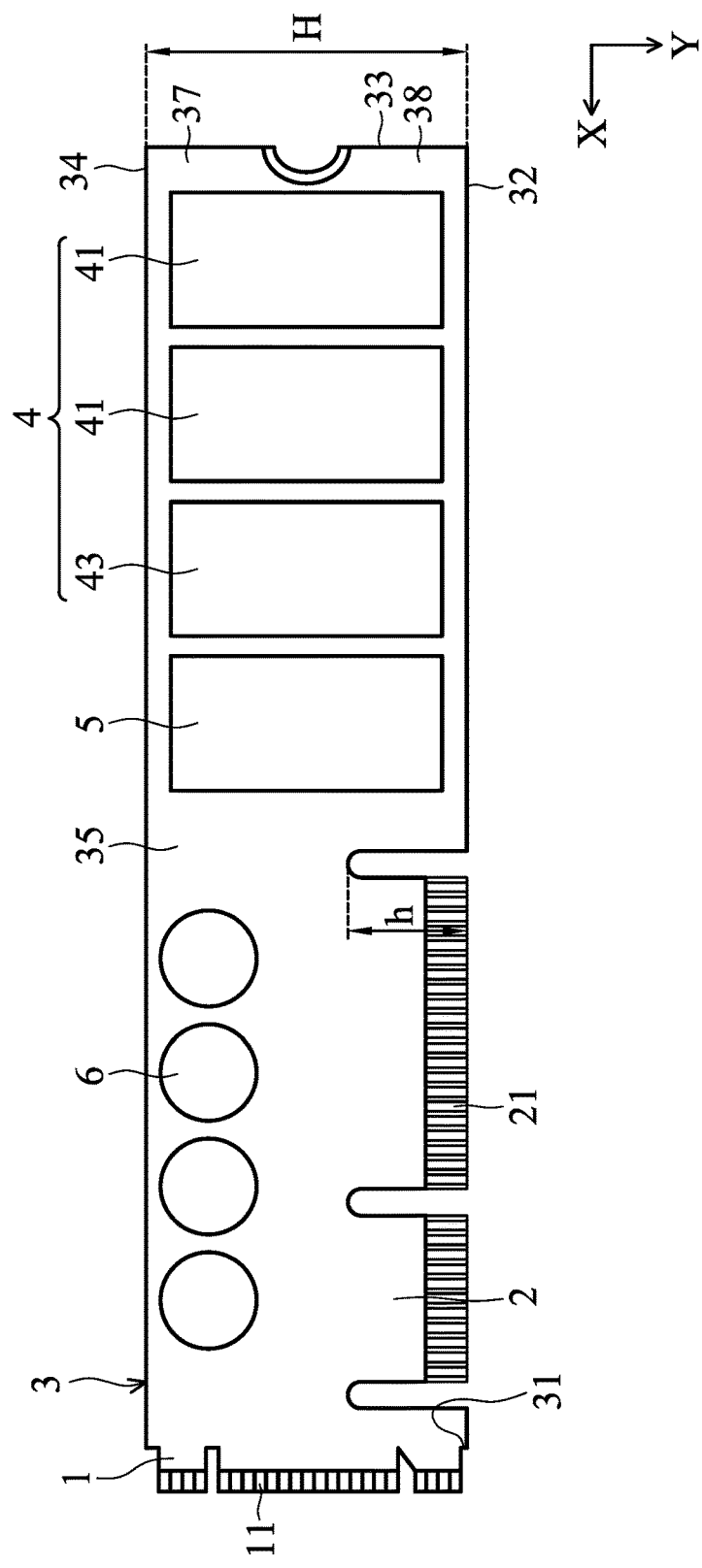
FIG. 3 shows a memory device of a third embodiment of the invention.

FIG. 3 shows a memory device M3 of a third embodiment of the invention. In this embodiment, the second interface connector 2 has a connector height h. The substrate 3 has a substrate height H. The connector height h is smaller than half of the substrate height H. In other words, the substrate 3 is equally compartmentalized into an upper substrate part 37 and a lower substrate part 38 in the second direction Y, and the second interface connector 2 is only located in the lower substrate part. In this embodiment, the second interface connector 2 is adapted to connect the PCIE slot and transmit data therewith. The size of the second interface connector 2 in this embodiment can be smaller than the standard PCIE connector. The memory device of the embodiment of the invention has decreased weight. Therefore, the second interface connector 2 of this embodiment can still firmly connect to the PCIE slot even with the smaller connector size.

In one embodiment, the size of the substrate can be 2260 (22 mm×60 mm) or 2280 (22 mm×80 mm), or other sizes.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
    a substrate, which comprises a first edge, a second edge, a third edge and a fourth edge, wherein the first edge is parallel to the third edge, the second edge is parallel to the fourth edge, the first edge is perpendicular to the second edge, and a length of the first edge is shorter than a length of the second edge;
    a first interface connector, disposed on the first edge, wherein the first interface connector comprises a plurality of first edge-board contacts, and the first edge-board contacts extend toward a first direction;
    a second interface connector, disposed on the second edge, the second interface connector comprises a plurality of second edge-board contacts, and the second edge-board contacts extend toward a second direction; and
    a plurality of memory chips, disposed on the substrate, wherein the second interface connector is located between the memory chips and the first interface connector in the first direction,
    wherein the first interface connector is adapted to be inserted into a first interface slot, the second interface connector is adapted to be inserted into a second interface slot,
    wherein the memory device is selectively connects to the first interface slot or the second interface slot.

2. The memory device as claimed in claim 1, wherein the memory chips are arranged in the first direction.

3. The memory device as claimed in claim 2, wherein the substrate comprises a first surface and a second surface, the first surface is opposite to the second surface, the memory chips comprise at least one first flash memory chip, and the first flash memory chip is disposed on the first surface.

4. The memory device as claimed in claim 3, further comprising a controller, wherein the controller is disposed on the first surface of the substrate, the controller is located between the first flash memory chip and the second interface connector in the first direction.

5. The memory device as claimed in claim 4, wherein the memory chips further comprise a DRAM chip, the DRAM chip is disposed on the first surface of the substrate, the DRAM chip is located between the first flash memory chip and the controller in the first direction.

6. The memory device as claimed in claim 5, wherein the memory chips comprise a plurality of first flash memory chips, the first flash memory chips are disposed on the first surface and arranged in the first direction, the first flash memory chips are located between the DRAM chip and the third edge.

7. The memory device as claimed in claim 4, further comprising at least one passive component, the passive component is located between the controller and the first interface connector in the first direction, and the passive component is located between the second interface connector and the fourth edge in the second direction.

8. The memory device as claimed in claim 7, wherein the passive component is a capacitor.

9. The memory device as claimed in claim 4, further comprising a plurality of passive components, the passive components are located between the controller and the first interface connector in the first direction, the passive components are located between the second interface connector and the fourth edge in the second direction, and the passive components are arranged in the first direction.

10. The memory device as claimed in claim 3, wherein the memory chips comprise a plurality of second flash memory chips, and the second flash memory chips are disposed on the second surface and are arranged in the first direction.

11. The memory device as claimed in claim 10, wherein the memory chips further comprise a DRAM chip, the DRAM chip is disposed on the second surface of the substrate, the DRAM chip and the second flash memory chip are arranged in the first direction.

12. The memory device as claimed in claim 1, wherein the first interface connector is an M.2 connector, and the second interface connector is a PCIE connector.

13. The memory device as claimed in claim 1, wherein the second interface connector has a connector height, the substrate has a substrate height, and the connector height is smaller than half of the substrate height.

14. The memory device as claimed in claim 1, wherein the substrate is equally compartmentalized into an upper substrate part and a lower substrate part in the second direction, and the second interface connector is only located in the lower substrate part.

* * * * *